(12) United States Patent
Kossives et al.

(10) Patent No.: US 6,649,422 B2
(45) Date of Patent: Nov. 18, 2003

(54) INTEGRATED CIRCUIT HAVING A MICROMAGNETIC DEVICE AND METHOD OF MANUFACTURE THEREFOR

(75) Inventors: Dean P. Kossives, Glen Gardner, NJ (US); Ashraf W. Lotfi, Bridgewater, NJ (US); Lynn F. Schneemeyer, Westfield, NJ (US); Michael L. Steigerwald, Martinsville, NJ (US); R. Bruce Van Dover, Maplewood, NJ (US)

(73) Assignee: Agere Systems Inc., Allentown, PA (US)

( * ) Notice: Subject to any disclaimer, the term of this patent is extended or adjusted under 35 U.S.C. 154(b) by 40 days.

(21) Appl. No.: 09/886,780

(22) Filed: Jun. 21, 2001

(65) Prior Publication Data
US 2001/0036702 A1 Nov. 1, 2001

Related U.S. Application Data

(62) Division of application No. 09/338,143, filed on Jun. 22, 1999, now Pat. No. 6,255,714.

(51) Int. Cl.[7] .............................................. H01L 21/00
(52) U.S. Cl. ........................ 438/3; 438/800; 365/145; 365/157; 365/158; 365/171
(58) Field of Search ..................... 438/3, 800; 365/145, 365/157, 158, 171

(56) References Cited

U.S. PATENT DOCUMENTS

| | | | |
|---|---|---|---|
| 3,729,807 A | 5/1973 | Fujiware |
| 3,873,944 A | 3/1975 | Vaguine et al. |
| 4,016,050 A | 4/1977 | Lesh et al. |
| 4,103,267 A | 7/1978 | Olschewski |
| 4,109,297 A | 8/1978 | Lesh et al. |
| 4,695,908 A | 9/1987 | Imakoshi |
| 4,713,297 A | 12/1987 | Verbunt |
| 4,740,657 A | 4/1988 | Tsukagoshi |
| 4,780,795 A | 10/1988 | Meinel |
| 4,826,787 A | 5/1989 | Muto et al. |
| 4,847,986 A | 7/1989 | Meinel |

(List continued on next page.)

FOREIGN PATENT DOCUMENTS

| | | |
|---|---|---|
| DE | 44 32 727 C1 | 3/1996 |
| EP | 0618 595 A1 | 10/1994 |
| EP | 681 319 A2 | 4/1995 |
| EP | 0 651 375 A1 | 5/1995 |
| EP | 0 716 433 A1 | 6/1996 |
| EP | 0 884 783 A2 | 12/1998 |
| JP | 01-053324 | 3/1989 |
| JP | 1053324 A | 3/1989 |
| JP | 04025102 A | 1/1992 |
| JP | 7-031147 | 1/1995 |

OTHER PUBLICATIONS

Sullivan and Sanders;Measured Performance of a High–Power–Density Microfabricated Transformer in a DC–DC Converter; 1996; pp. 287–294.

(List continued on next page.)

*Primary Examiner*—Matthew Smith
*Assistant Examiner*—Victor V. Yesvsikov

(57) ABSTRACT

An integrated circuit and method of manufacturing therefor. In one embodiment, the integrated circuit includes a substrate with an insulator and a capacitor formed over the substrate. The integrated circuit further includes an adhesive formed over the insulator. The integrated circuit still further includes a micromagnetic device. The micromagnetic device includes a ferromagnetic core formed over the adhesive. The adhesive forms a bond between the insulator and the ferromagnetic core to secure the ferromagnetic core to the substrate. The micromagnetic device also includes at least one winding, located proximate the ferromagnetic core, to impart a desired magnetic property to the ferromagnetic core. The micromagnetic device is electrically coupled to the capacitor.

18 Claims, 15 Drawing Sheets

U.S. PATENT DOCUMENTS

| | | | |
|---|---|---|---|
| 4,853,080 | A | 8/1989 | Anthony |
| 4,939,610 | A | 7/1990 | Narishige |
| 4,966,648 | A | 10/1990 | Nakamura et al. |
| 4,975,671 | A | 12/1990 | Dirks |
| 4,987,009 | A | 1/1991 | Nakamura et al. |
| 5,037,517 | A | 8/1991 | Randawa |
| 5,070,317 | A | 12/1991 | Bhagat |
| 5,155,643 | A | 10/1992 | Jones, Jr. et al. |
| 5,173,671 | A | 12/1992 | Wendler et al. |
| 5,276,793 | A | 1/1994 | Gobel et al. |
| 5,312,674 | A | 5/1994 | Haertling et al. |
| 5,323,292 | A | 6/1994 | Brzezinski et al. |
| 5,432,734 | A | 7/1995 | Kawano et al. |
| 5,450,263 | A * | 9/1995 | Desaigoudar et al. ........ 360/110 |
| 5,452,163 | A | 9/1995 | Coffey et al. |
| 5,469,334 | A | 11/1995 | Balakrishnan |
| 5,495,125 | A | 2/1996 | Uemura |
| 5,512,818 | A | 4/1996 | Jin et al. |
| 5,532,667 | A | 7/1996 | Heartling et al. |
| 5,587,130 | A | 12/1996 | Bao et al. |
| 5,590,250 | A | 12/1996 | Lamping et al. |
| 5,610,449 | A | 3/1997 | Takahashi et al. |
| 5,633,522 | A | 5/1997 | Dorleans et al. |
| 5,659,462 | A | 8/1997 | Chen et al. |
| 5,667,884 | A | 9/1997 | Bolger |
| 5,777,386 | A | 7/1998 | Higashi et al. |
| 5,787,568 | A | 8/1998 | Lofti et al. |
| 5,801,602 | A | 9/1998 | Fawal et al. |
| 5,828,117 | A | 10/1998 | Kondo et al. |
| 5,901,901 | A | 5/1999 | Schneegans et al. |
| 5,933,327 | A | 8/1999 | Leighton et al. |
| 5,939,641 | A | 8/1999 | Lofti et al. |
| 5,952,909 | A | 9/1999 | Umeno et al. |
| 6,049,258 | A | 4/2000 | Fawal et al. |
| 6,055,179 | A | 4/2000 | Kogenei et al. |
| 6,057,237 | A | 5/2000 | Ding et al. |
| 6,118,351 | A | 9/2000 | Kossives et al. |
| 6,121,647 | A | 9/2000 | Yano et al. |
| 6,160,721 | A | 12/2000 | Kossives et al. |
| 6,163,234 | A | 12/2000 | Kossives et al. |
| 6,191,495 | B1 | 2/2001 | Kossives et al. |
| 6,249,039 | B1 * | 6/2001 | Harvey et al. ............... 257/531 |
| 6,255,714 | B1 | 7/2001 | Kossives et al. |
| 6,440,750 | B1 * | 8/2002 | Feygenson et al. ............ 438/3 |

OTHER PUBLICATIONS

Tsukamoto et al.; A Compact Buck–Converter Using a Thin–Film Inductor; 1996; pp. 422–426.

Inoue et al; 5 MHz Switching Micro DC–DC Converter Using Planar Inductor; 1996; pp 485–490.

Taylor; Design and Methodology for the Fabrication of an Integrated Electromagnet for Use as a Driving Element; 1995; pp. 15–22.

Frye et al.; Silicon–on–Silicon MCM's with Integrated Passive Components; 1992; pp 155–158.

Wasa and Hayakawa; Handbook of Sputter Depositing Technology; 1992; pp 37–47.

* cited by examiner

INTEGRATED CIRCUIT HAVING A MICROMAGNETIC DEVICE AND METHOD OF MANUFACTURE THEREFOR

This application is a divisional of application Ser. No. 09/338,143 filed Jun. 22, 1999, now U.S. Pat. No. 6,255,714. The above listed application Ser. No. 09/338,143 is commonly assigned with the present invention and is incorporated herein by reference.

CROSS-REFERENCE TO RELATED APPLICATIONS

This application is related to the following U.S. patent applications:

| Reference No. | Title | Inventor(s) | File Date |
|---|---|---|---|
| Kossives 8-8-4-15-22 | A Micromagnetic Device for Power Processing Applications and Method of Manufacture Therefor | Kossives, et al. | Jun. 10, 1997 |
| Kossives 13-12-19-17-30 | A Micromagnetic Device for Data Transmission Apllications and Method of Manufacture Therefor | Kossives, et al. | Jul. 2, 1998 |
| Kossives 14-15-11-19-32 | A Micromagnetic Device having an Anisotropic Ferromagnetic Core and Method of Manufacture therefor | Kossives, et al. | |

The above-listed applications are commonly assigned with the present invention and are incorporated herein by reference as if reproduced herein in their entirety.

1. Technical Field of the Invention

The present invention is directed, in general, to integrated circuits and, more specifically, to an integrated circuit having a capacitor and a ferromagnetic core and a method of manufacture therefor.

2. Background of the Invention

A magnetic device includes a magnetic core coupled to conductor windings such that magnetic flux flows in a closed path about the core. Magnetic devices are generally configured in an EE-type structure or a toroidal geometry. In the EE-type magnetic device, a first and second core-portion of the magnetic core surround the conductor windings. In the toroidal magnetic device, a first and second winding-portion of the conductor windings surround the magnetic core.

Micromagnetic devices (e.g., microinductors or microtransformers) are micron-scaled integrated circuit magnetic devices; the electromagnetic properties of the device are provided by the presence of the magnetic core and conductor windings. In the past, micromagnetic devices were only applicable to low-level signal applications (e.g., recording heads). With the advancement in production techniques for integrated circuits, it is now possible to fabricate micromagnetic devices for relatively large signal, power processing, high speed data transmission and other applications. For instance, micromagnetic devices may be employed in power systems for wireless communications equipment or in data transmission circuits.

While many power semiconductor devices (having ferrite cores, for instance) have been scaled down into integrated circuits, inductive elements at the present time remain discrete and physically large. Of course, there is a strong desire to miniaturize these inductive components as well. By extending thin-film processing techniques employed in power semiconductor devices to ferromagnetic materials, the size of the conventional discrete ferromagnetic-core inductive devices can be reduced significantly. Ferromagnetic materials such as alloys, however, have much higher saturation flux densities than ferrites (e.g., 10–20 kG verses 3 kG), thereby reducing the physical volume of the core for a given inductance and energy requirement. To limit the eddy current losses in the ferromagnetic materials, the materials must be fabricated in inordinately thin films. Processing thin-film ferromagnetic materials with traditional rolling and tape winding techniques proves to be very costly as the desired tape thicknesses drops below 0.001 inches (i.e., 25 μm). It is thus advantageous to produce such thin films by other integrated circuit deposition techniques such as sputtering or electroplating.

Another germane consideration associated with manufacturing micromagnetic devices is securing the ferromagnetic material to a silicon substrate or the like. More specifically, forming an adequate bond between the ferromagnetic material and an insulator coupled to the substrate is an important consideration. Many factors (such as oxide formation, melting point temperature, interposed contamination, affinity between materials and mechanical stress at the interface) may influence the adhesion of a thin film to a substrate. For instance, one technique readily employed in thin film manufacturing processes is the formation of an oxide-metal bond at the interface between the substrate and the film. The oxide-metal bond may be formed by employing an oxygen-active metal (such as tungsten or chromium) on an oxygen-bearing substrate (such as glass or ceramic) in conjunction with a refractory metal (such as tantalum or tungsten). With regard to contaminants, it is advantageous to remove any impurities interposed on the substrate. Cleaning methods vary in effectiveness and the method selected depends on the ability of the deposition process to dislodge contaminant atoms. As an example, different cleaning techniques may be employed with sputtering or electroplating.

Of course, the ultimate consideration with regard to the adhesion properties depends on the materials employed. While others have attempted to address the adhesion of ferromagnetic materials to an insulator coupled to a substrate [e.g., *Measured Performance of a High-Power-Density Microfabricated Transformer in a DC-DC Converter*, by Charles R. Sullivan and Seth R. Sanders, IEEE Power Electronics Specialists Conference, p. 287–294 (July 1996), which is incorporated herein by reference], to date, the problem remains unresolved. The development of an adhesive material that simultaneously forms a bond with the insulator and the ferromagnetic material such that thin-film processing can be applied to inductive elements would provide a foundation for the introduction of micromagnetic devices into a variety of integrated circuit applications.

Regarding magnetic properties, current micromagnetic devices are typically isotropic in that their properties are the same when measured in different directions. Although anisotropic properties are generally known in the domain of magnetics, anisotropic properties have not been employed in the design of micromagnetic devices due, in part, to the limitations as addressed above regarding the fabrication of micromagnetic integrated circuits. Micromagnetic devices with the ability to induce a designed magnetic anisotropic property into the core, having a desired direction and characteristic, would be very useful.

Micromagnetic devices, which may be constructed using improved adhesive materials and having a magnetic anisotropic property designed into the core would facilitate a broad variety of integrated circuit applications. Some of these micromagnetic application areas include circuits for power processing, data transmission, radio frequency and motor control integrated circuits. In summary, the ability to integrate micromagnetic devices with any other active or passive circuit component such as transistors, diodes, capacitors, resistors and the like, to form essentially any totally integrated circuit would be very useful.

Accordingly, what is needed in the art is an integrated circuit that not only includes a micromagnetic device, but includes other microcomponents such as capacitors and transistors.

SUMMARY OF THE INVENTION

To address the above-discussed deficiencies of the prior art, the present invention provides an integrated circuit and method of manufacturing therefor. In one embodiment, the integrated circuit includes a substrate with an insulator and a capacitor formed over the substrate. The integrated circuit further includes an adhesive formed over the insulator. The integrated circuit still further includes a micromagnetic device. The micromagnetic device includes a ferromagnetic core formed over the adhesive. The adhesive forms a bond between the insulator and the ferromagnetic core to secure the ferromagnetic core to the substrate. The micromagnetic device also includes at least one winding, located proximate the ferromagnetic core, to impart a desired magnetic property to the ferromagnetic core. The micromagnetic device is electrically coupled to the capacitor. The integrated circuit may be employed in various applications such as filter circuits.

In addition to the micromagnetic device, in a related, but alternative embodiment, the integrated circuit includes a transistor formed on the substrate and electrically coupled to the ferromagnetic core. The capacitor, micromagnetic device and transistor may be employed with other components in RF circuits, power processing circuits or other circuits.

The present invention introduces the broad concept of providing a micromagnetic device and capacitor in an integrated circuit. Those skilled in the art can readily understand the advantages and vast applications for such devices in integrated circuits. The present invention in another aspect also introduces a transistor into the integrated circuit thereby further expanding its applications. It should be understood that other components may also be incorporated into the integrated circuit and be within the broad scope of the present invention.

The foregoing has outlined, rather broadly, features of the present invention so that those skilled in the art may better understand the detailed description of the invention that follows. Additional features of the invention will be described hereinafter that form the subject of the claims of the invention. Those skilled in the art should appreciate that they can readily use the disclosed conception and specific embodiment as a basis for designing or modifying other structures for carrying out the same purposes of the present invention. Those skilled in the art should also realize that such equivalent constructions do not depart from the spirit and scope of the invention in its broadest form.

BRIEF DESCRIPTION OF THE DRAWINGS

For a more complete understanding of the present invention, reference is now made to the following descriptions taken in conjunction with the accompanying drawings, in which.

DETAILED DESCRIPTION

Figure 1A:
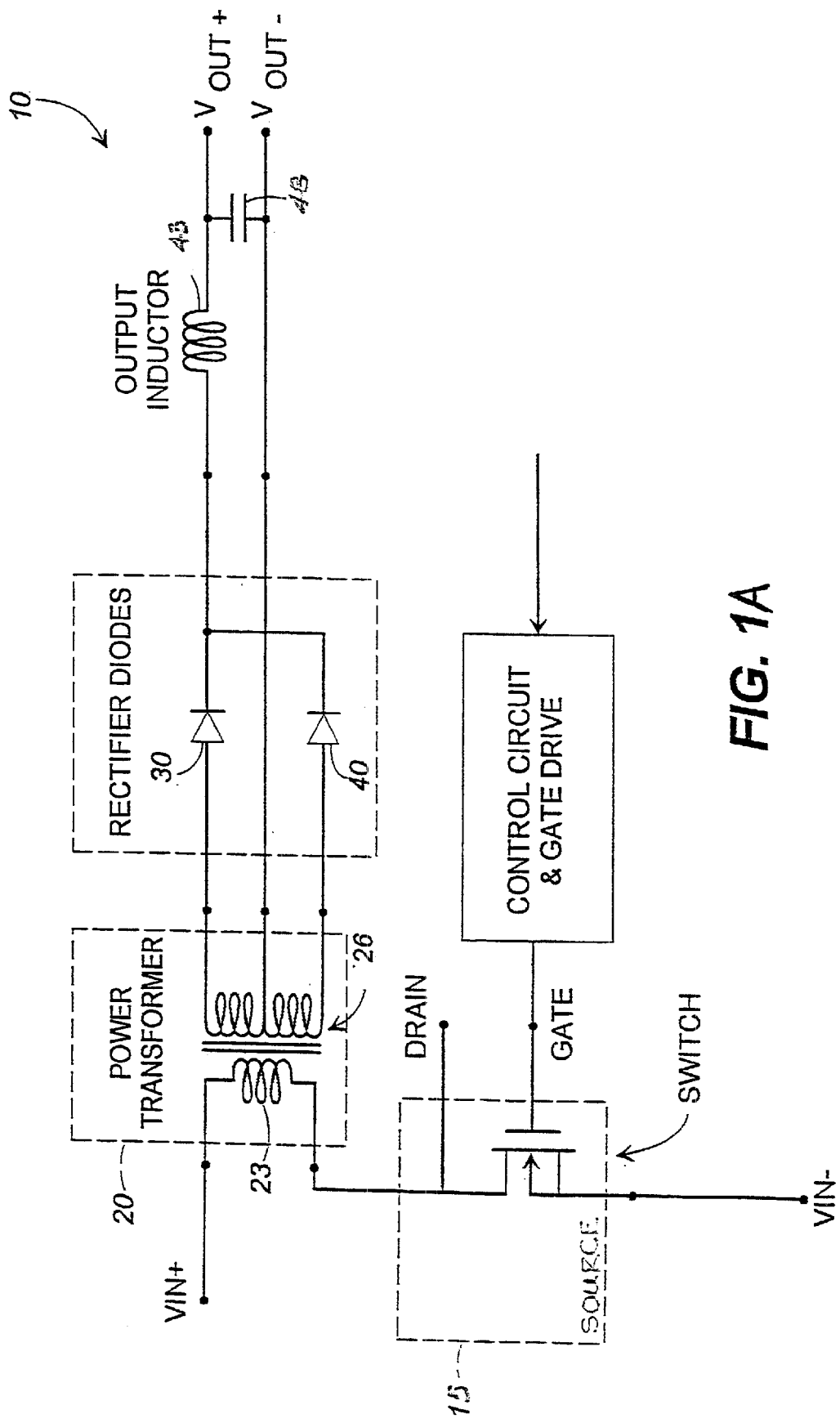
FIG. 1A illustrates a schematic diagram of an embodiment of a power processing circuit constructed according to the principles of the present invention.

Referring initially to FIG. 1A, illustrated is a schematic diagram of an embodiment of a power processing circuit 10 constructed according to the principles of the present invention. The power processing circuit 10 includes a power train having a conversion stage including a switching circuit 15 for receiving input electrical power $V_{IN}$ and producing therefrom switched electrical power. The power processing circuit 10 further includes a filter circuit (including an output inductor 43 and output capacitor 48) for filtering the switched electrical power to produce output electrical power (represented as a voltage $V_{OUT}$).

The power processing circuit 10 still further includes a power micromagnetic device (e.g., transformer) 20, having a primary winding 23 and a secondary winding 26, and a rectifier (including rectifying diodes 30, 40) coupled between the power conversion stage and the filter stage. In accordance with the principles as hereinafter described, the power processing circuit 10 including, for instance, the transformer 20, the output inductor 43 and the output capacitor 48, may be formed into an integrated circuit. It should be clear, however, that the power processing circuit 10 is submitted for illustrative purposes only and other circuits and applications therefor are well within the broad scope of the present invention.

Figure 1B:
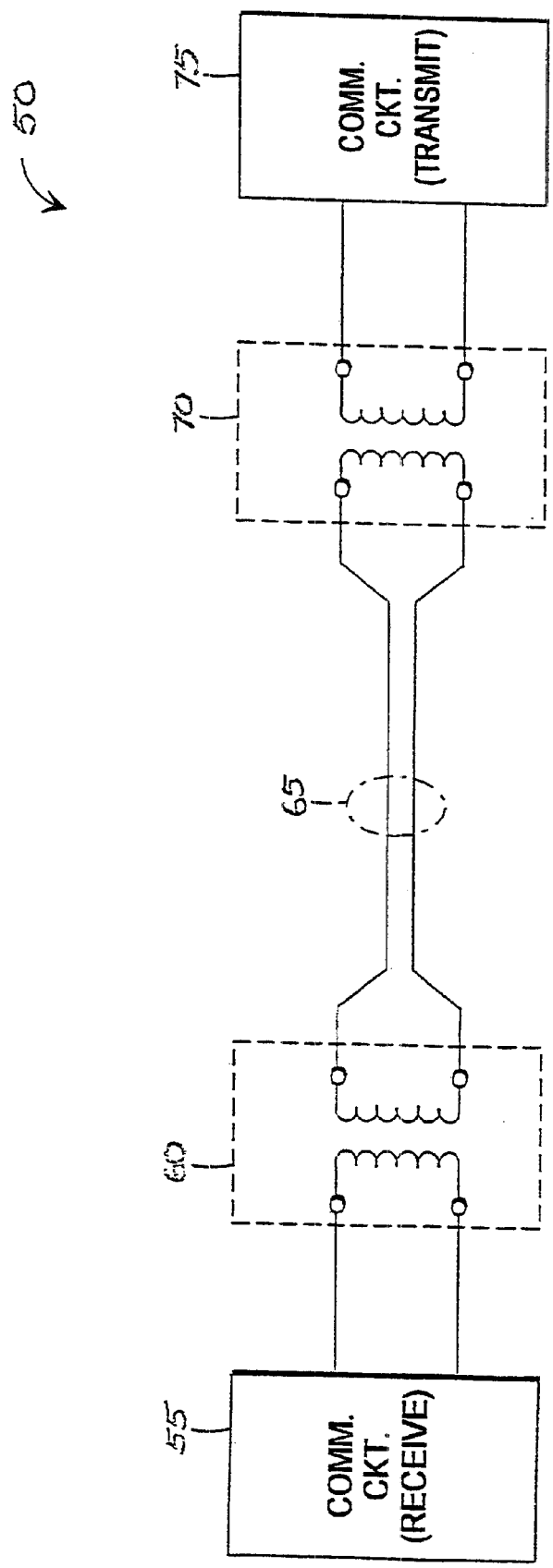
FIG. 1B illustrates a schematic diagram of an embodiment of a data transmission circuit constructed according to the principles of the present invention.

Turning now to FIG. 1B, illustrated is a schematic diagram of an embodiment of a data transmission circuit 50 constructed according to the principles of the present invention. The data transmission circuit 50 includes a first communications circuit 55 for receiving a communications signal. The data transmission circuit 50 further includes a second communications circuit 75 for transmitting the communications signal. The data transmission circuit 50 further includes a transmission line cable 65 having a characteristic impedance $Z_o$, coupling the first communications circuit 55 to the second communications circuit 75. The data transmission circuit 50 still further includes first and second data transmission micromagnetic devices 60, 70, coupled between the transmission line cable 65 and the first and second communications circuits 55, 75, respectively. The first and second data transmission micromagnetic devices 60, 70 are constructed according to the principles of the present invention as hereinafter described.

In the illustrated embodiment, the first and second data transmission micromagnetic devices 60, 70 may perform several functions including, without limitation, voltage transformation, impedance transformation from a transmitter impedance of the second communications circuit 75 to the characteristic impedance $Z_o$ and from the characteristic impedance $Z_o$ to a receiver impedance of the first communications circuit 55. Other functions include unbalanced to balanced signal conversion and electromagnetic interference suppression. In accordance with the principles as hereinafter described, the data transmission circuit 50 including, for instance, first and second data transmission micromagnetic devices 60, 70, may be formed into an integrated circuit. The data transmission circuit 50 and first and second data transmission micromagnetic devices 60, 70 are submitted for illustrative purposes only and other circuits and applications therefor are well within the broad scope of the present invention.

Figure 1C:
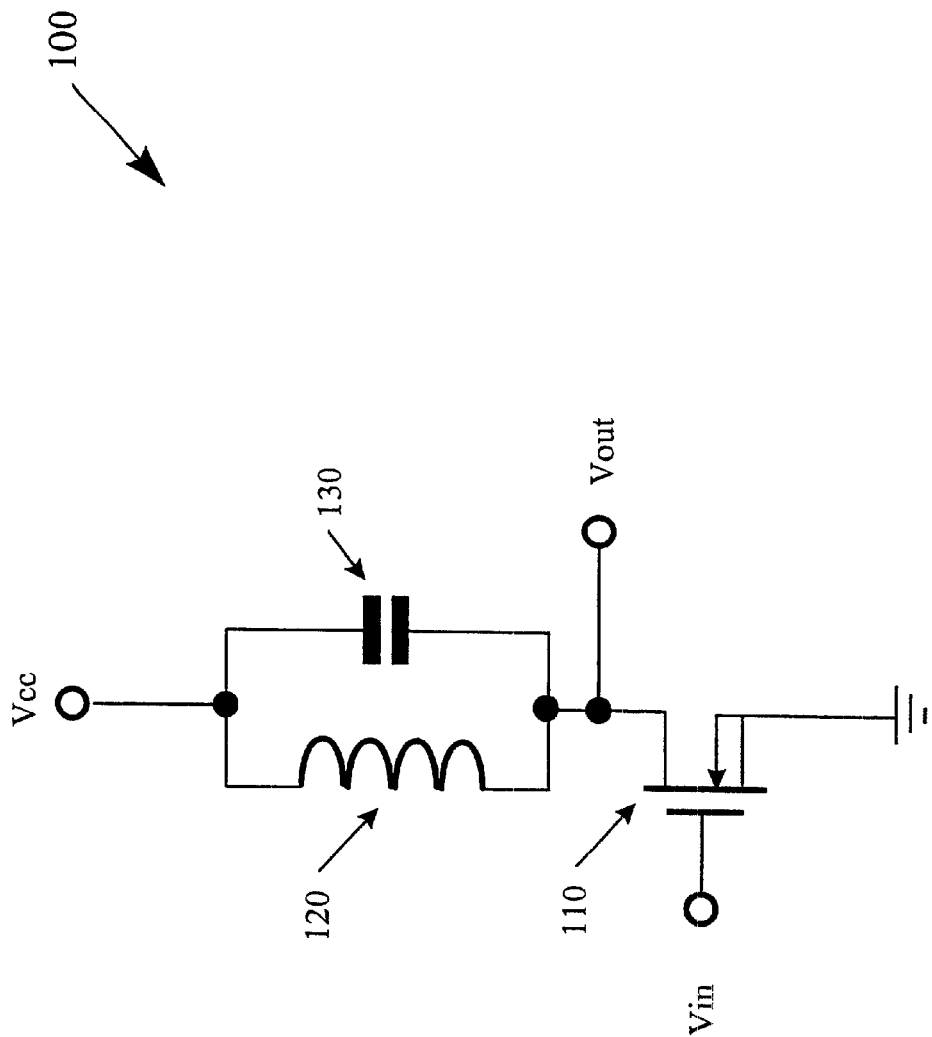
FIG. 1C illustrates a schematic diagram of an embodiment of an RF circuit constructed according to the principles of the present invention.

Turning now to FIG. 1C, illustrated is a schematic diagram of an embodiment of an RF circuit 100 constructed according to the principles of the present invention. The RF circuit 100 includes an N-channel MOSFET 110, a micromagnetic inductor 120 and a capacitor 130. The RF circuit 100 is an RF amplifier that receives an input signal Vin at an RF frequency determined by the resonant frequency of the parallel combination of the micromagnetic inductor 120 and the capacitor 130. An amplified output signal Vout may then be provided to another circuit as appropriate. The n-channel MOSFET 110, the micromagnetic inductor 120 and the capacitor 130 are constructed according to the principles of the present invention as hereinafter described. Of course, the RF circuit 100 is exemplary of other RF circuits such as filters, modulators, demodulators or other parallel or series tuned circuits that may be employed.

Figure 1D:
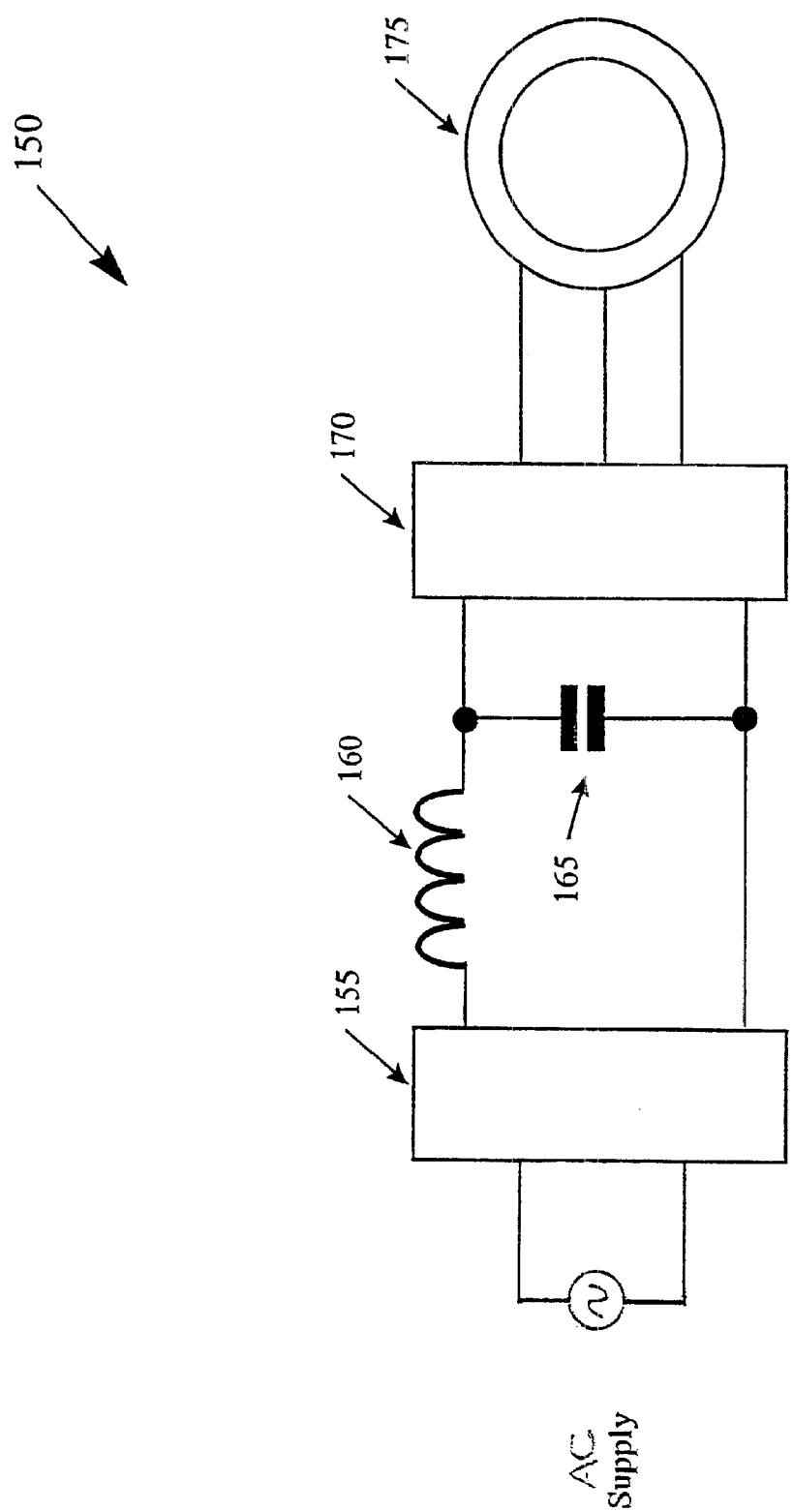
FIG. 1D illustrates a schematic diagram of a motor control circuit constructed according to the principles of the present invention.

Turning now to FIG. 1D, illustrated is a schematic diagram of a motor control circuit 150 constructed according to the principles of the present invention. The motor control circuit 150 includes a rectifier system 155, a micromagnetic inductor 160, a capacitor 165, an inverter/controller system 170 and a motor 175. The rectifier system 155, which may accommodate single-phase or three-phase AC supplies, converts an AC voltage to a DC voltage, and the combination of the micromagnetic inductor 160 with the capacitor 165 forms a low pass filter to further smooth the DC voltage presented to the inverter/controller 170. The inverter/controller 170 then converts the DC voltage into a three-phase signal that drives the motor 175. The inverter/controller 170 may use a pulse width modulation (PWM) technique to allow variable motor speed control. The motor control circuit 150 including, for instance, the low pass filter (the micromagnetic inductor 160 and the capacitor 165) as well as the rectifier system 155 and the inverter/controller system 170 are constructed according to the principles of the present invention as hereinafter described.

Figure 2A:
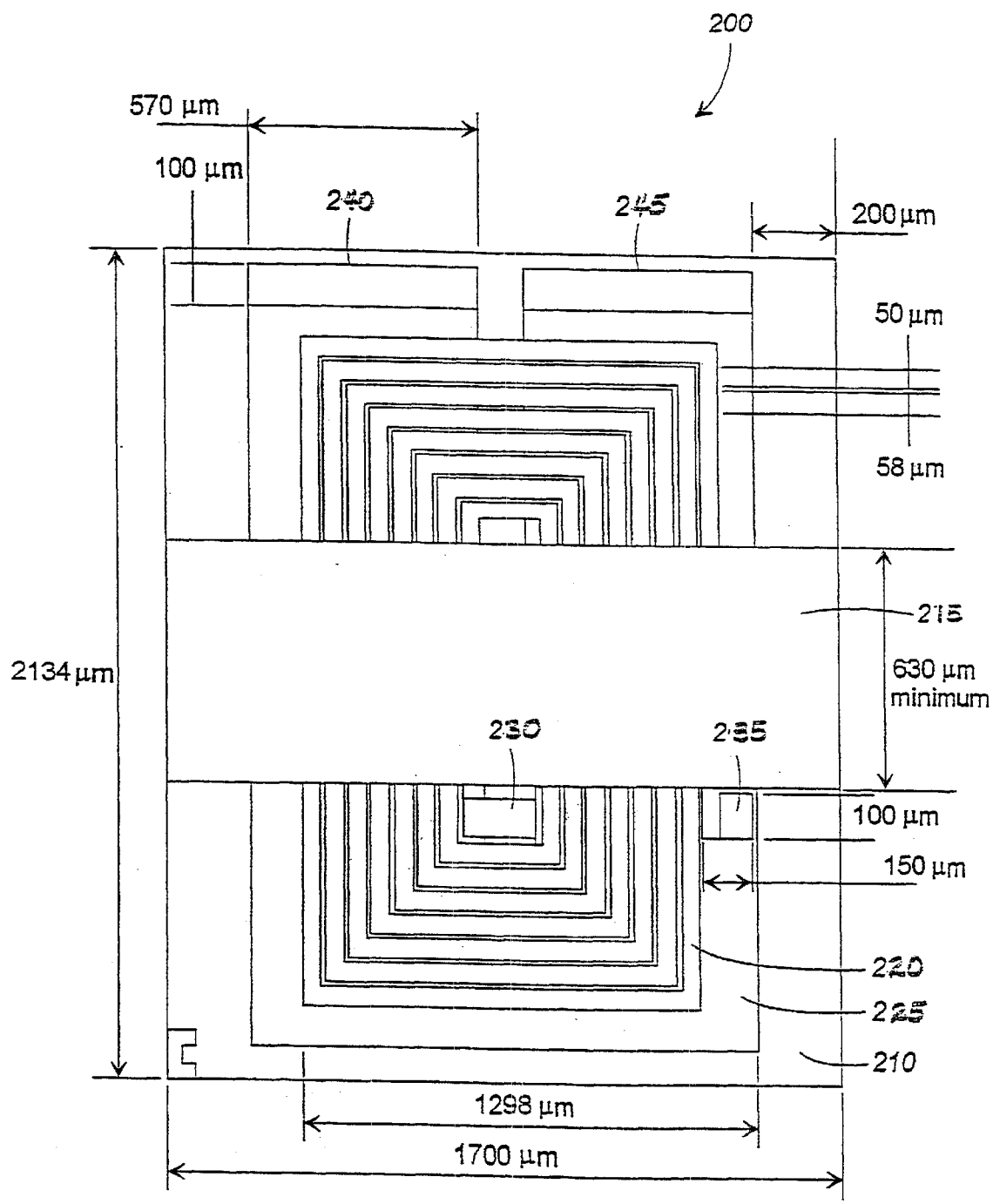
FIG. 2A illustrates a top view of an embodiment of a micromagnetic device constructed according to the principles of the present invention.

Turning now to FIG. 2A, illustrated is a top view of an embodiment of a micromagnetic device 200 constructed according to the principles of the present invention. The micromagnetic device 200 is an EE-type transformer device. The micromagnetic device 200 includes a ferromagnetic core having a first core-portion 210 and a second core-portion 215. While the ferromagnetic core may be composed of an alloy (e.g., a permalloy™ composed of nickel-iron including about 80% nickel and 20% iron), other ferromagnetic materials are well within the broad scope of the present invention. The micromagnetic device 200 also includes conductive windings having a primary winding 220 and a secondary winding 225. Of course, the windings may be formed from any conductive material. The primary winding 220 terminates in a plurality of terminals 230, 235; the secondary winding 225 terminates in a plurality of terminals 240, 245.

The first and second core-portions 210, 215 surround the primary and secondary windings 220, 225. The magnetic flux of the micromagnetic device 200 predominantly flows along the width of the ferromagnetic core. As a result, the ferromagnetic core is anisotropic, thereby controlling hysteresis losses at higher frequencies (e.g., above 10 MHZ). The first and second core-portions 210, 215 may be coupled together by magnetic vias (when anisotropic characteristics and control are desired) or remain separate (when an air gap is desired). The EE-type structure effectively controls the permeability of the ferromagnetic core by regulating the direction of the induced anisotropy with respect to the magnetic field vector.

With regard to the ferromagnetic material, the total thickness thereof is selected based on the inductance requirements of the device. For operation at relatively high frequencies (e.g., above 10 MHZ), eddy currents induced in the ferromagnetic materials can become problematic due to the resulting low resistivity (e.g., $\rho \sim 20\text{--}100 \, \mu\Omega\text{cm}$). To reduce the eddy currents, the magnetic film thickness of the ferromagnetic material should be limited to a fraction of the skin depth $\delta$ [where $\delta=(\rho/\Pi f \mu)^{1/2}$ for a given frequency f of operation]. For instance, at 8 MHZ and $\mu=1000$, the skin depth is about 2.5 $\mu$m; thus, to limit the effect of the eddy currents, the film thickness should be below about 2 $\mu$m (obviously, thinner films are necessary as the permeability increases). When the inductance specification requires a larger thickness, insulated multiple layers of film (with each layer not exceeding the necessary skin thickness) should be employed.

For use in data transmission applications, for instance, performance of the micromagnetic device 200 at high data transmission rates may be affected by parasitic elements. Leakage inductances and interwinding capacitances may cause distortions, overshoots, and backswings that may place a transmitted pulse of data outside an acceptable transmission template. Such parasitic elements may be influenced by a physical size and arrangement of the micromagnetic device 200. The parasitic elements, however, may be reduced by miniaturizing the micromagnetic device 200 using the principles of the present invention.

Figure 2B:
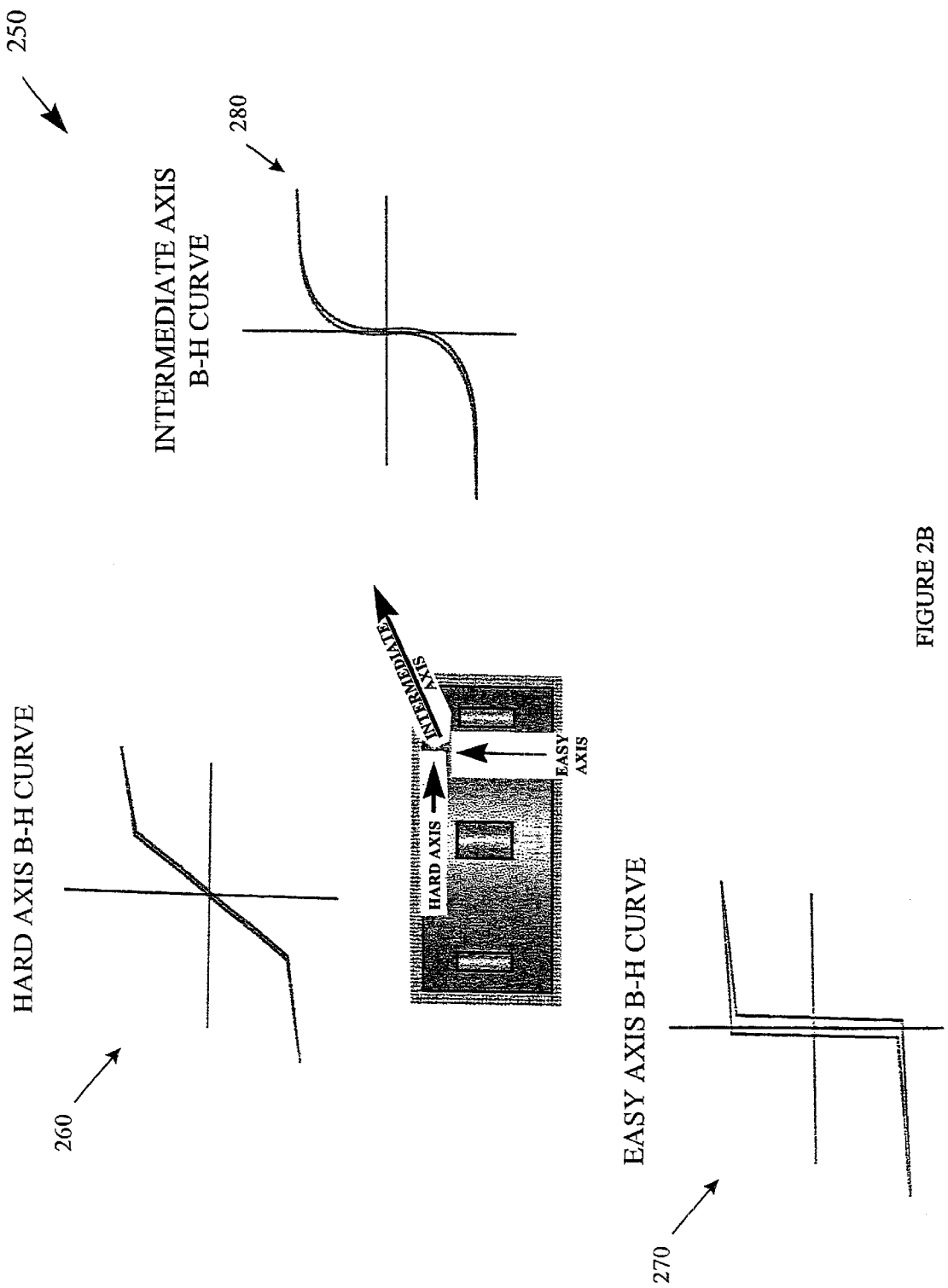
FIG. 2B illustrates a top view of a micromagnetic device showing the resulting B-H curves for various external magnetic field orientations at deposition.

Turning now to FIG. 2B, illustrated is a top view of a micromagnetic device 250 showing the resulting B-H curves for various external magnetic field orientations at deposition. The B-H curve is a plot of magnetic flux density (B) verses magnetic magnetizing force (H) for a magnetic material. As discussed in FIG. 2A, the magnetic flux of the micromagnetic device 200 predominantly flows along the width of the ferromagnetic core. This effect causes the ferromagnetic core to be anisotropic due to the construction geometry. An anisotropy property may also be introduced during the deposition process, when conducted in an external magnetic field, using an energized solenoid or permanent magnet. The external magnetic field is normally uniform and may be applied at levels of 10–500 Oersteds [("Oe"); 8000–40000 A/m]. Of course, some cases may exist where the application of a non-uniform external magnetic field may be useful. In the present embodiment, the induced anisotropy produces both a hard axis and an easy axis, along which the permeability is a minimum and maximum, respectively. Additionally, the hard axis and the easy axis are seen to be substantially transverse in this embodiment. Of course, other embodiments may employ other orientations between the hard axis and the easy axis.

The micromagnetic device 250 shows a hard axis B-H curve 260 and an easy axis B-H curve 270. Permeability is proportional to the slope of the B-H curve, typically defined in the middle region of the B-H curve, which corresponds to the non-saturated operating region of the magnetic core. In some cases, the permeability may be increased five-fold from the hard axis to the easy axis as a result of the anisotropy. An intermediate axis B-H curve 280 is also shown, which has characteristics different from the hard axis and easy axis B-H curves 260, 270. The intermediate B-H curve 280 is typical of tailored B-H curves, which may be created during deposition of the micromagnetic core by orienting the external magnetic field in a desired direction.

Figure 3:
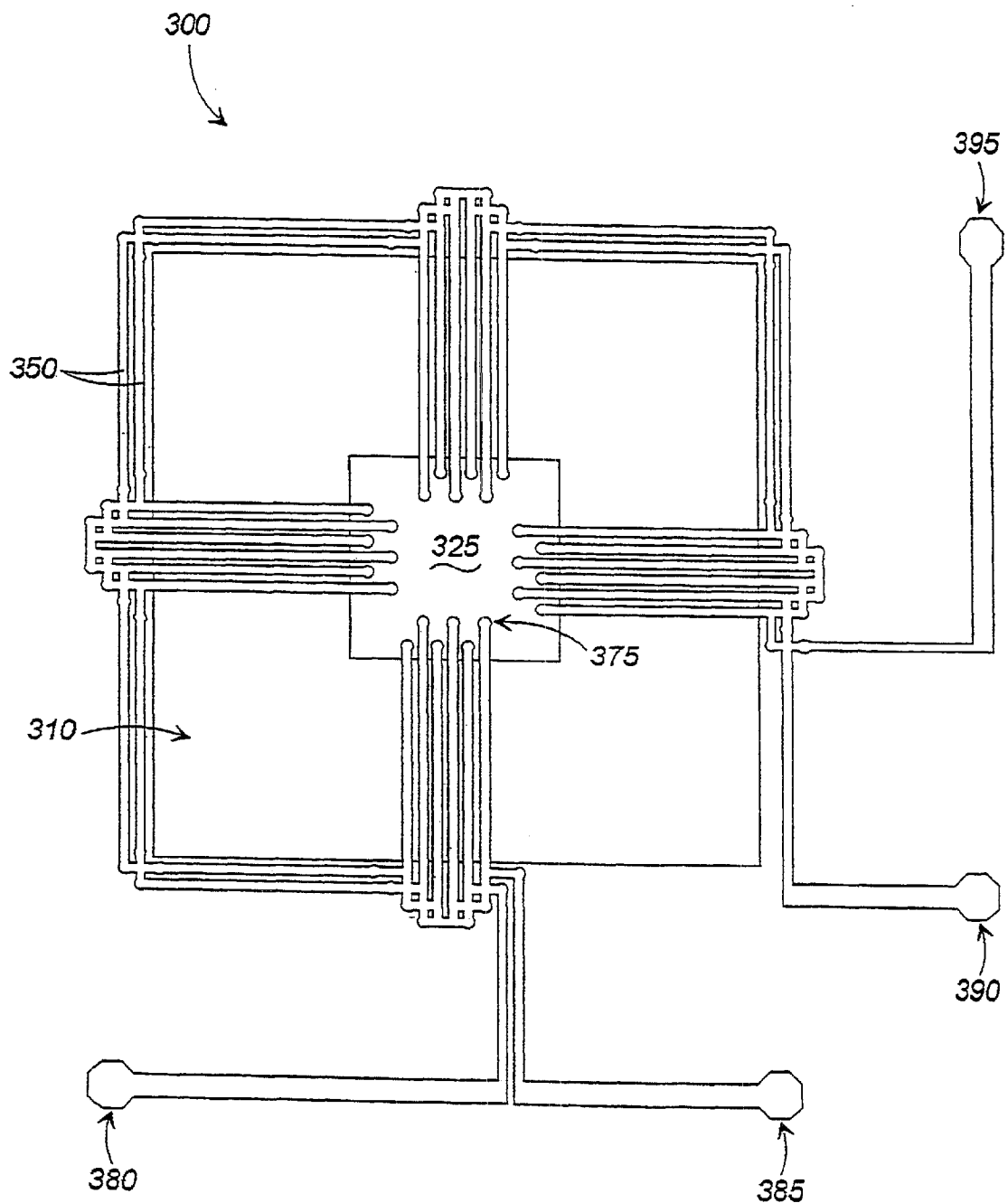
FIG. 3 illustrates a top view of another embodiment of a micromagnetic device constructed according to the principles of the present invention.

Turning now to FIG. 3, illustrated is a top view of another embodiment of a micromagnetic device 300 constructed according to the principles of the present invention. The micromagnetic device 300 is a toroidal transformer device. The micromagnetic device 300 includes a ferromagnetic core 310 (proximate a window 325) and conductive windings (collectively designated 350) that surround the ferromagnetic core 310 through inner-layer connection vias (one of which as designated 375) and terminate in a plurality of terminals 380, 385, 390, 395. The inner-layer connection vias 375 lie within the window 325.

Rules regarding line space and via-to-via distance determine the size of the window 325. Obviously, with the trend towards smaller devices, a smaller window dimension is desirable. The dimension of the window 325, however, is limited by the thickness of the ferromagnetic material necessary to achieve the required inductance characteristics. For example, the inductance of a toroidal device is maximized if the toroid is generally circular. The inductance is less if the toroid is formed into a square (~25% less), degrading further as the square is elongated into a rectangle. The inductance L for a square toroid having a core width to meet a minimum window dimension, is:

$$L=\mu_0[N^2 t]/4(1+\Pi)$$

where N is the number of turns of the conductive windings 350 and t is the thickness of the film. The size of the window 325 is determined by the minimum via size, via-via clearance and the number of vias (related to the number of primary and secondary turns). Therefore, to reduce the die size of the device, a larger core thickness is necessary to obtain an equivalent inductance to an EE ferromagnetic core of equal winding turns and core width.

Remember that, for the EE-type structure, fewer winding connection vias are required, thereby reducing the amount of die space necessary to couple the windings to the core. Toroidal transformers, however, offer a relatively flat and smooth surface for the deposition of the ferromagnetic material, thereby reducing the formation of stresses that may degrade the magnetic properties of the film deposited thereon. This is especially important when the ferromagnetic material has a high magnetostriction constant. The EE-type structure also requires special provisions to create a continuous magnetic path from the first core-portion to the second core-portion. This is accomplished by introducing vias within the central core region and at the two outer core edges. The vias provide connectivity for the ferromagnetic material such that the first and second core-portions are coupled together continuously. The vias, however, are a source of stress concentration that require additional slope reduction to decrease the accumulated stresses.

While FIGS. 2 and 3 illustrate both the EE-type and toroidal transformer device (including the advantages and disadvantages thereof), other micromagnetic devices (including variations of the foregoing devices) and applications therefor are well within the broad scope of the present invention.

Figure 4:
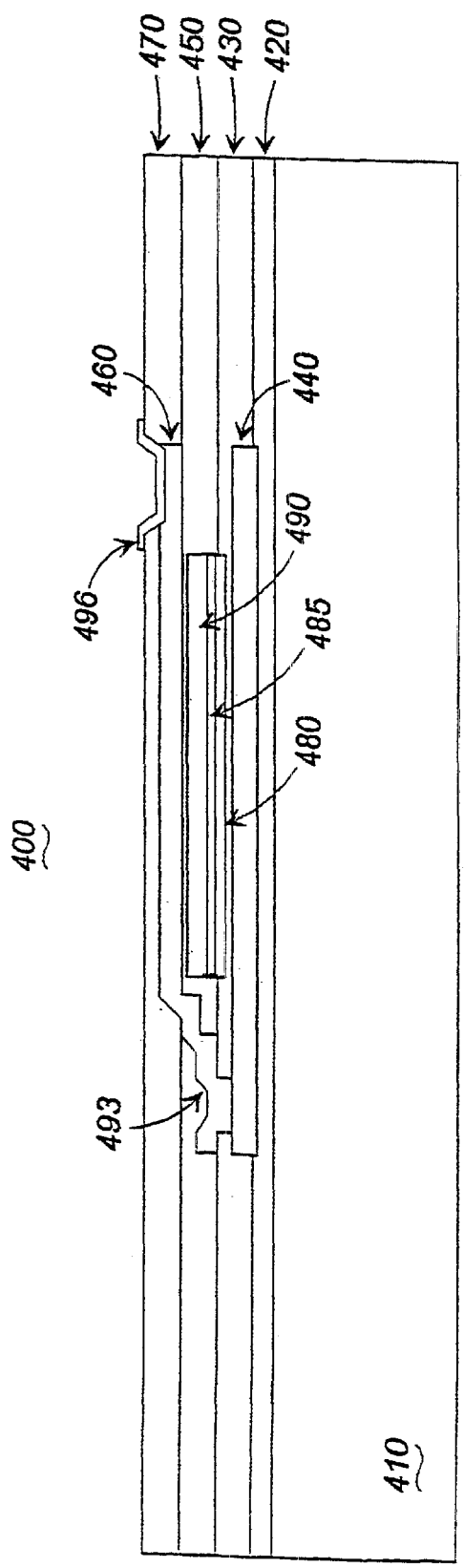
FIG. 4 illustrates a cross-sectional view of an embodiment of an integrated circuit including a micromagnetic device constructed according to the principles of the present invention.

Turning now to FIG. 4, illustrated is a cross-sectional view of an embodiment of an integrated circuit 400 including a micromagnetic device constructed according to the principles of the present invention. The integrated circuit 400 may be employed in a power processing, data transmission or any other circuit. The integrated circuit 400 includes a substrate (composed of, for instance, silicon, glass, ceramic or the like) 410 having a passivation layer (e.g., silicon-dioxide) 420 formed thereon using conventional formation processes such as a thermal growing process. The integrated circuit 400 further includes first and second conductive winding layers (composed of, for instance, aluminum or any other conductive material) 440, 460 surrounded by first, second and third insulative layers or insulators 430, 450, 470. The integrated circuit 400 still further includes an adhesive (a metallic adhesive in the illustrated embodiment) that contains a first adhesive layer (e.g., chromium) 480 and a second adhesive layer (e.g., silver) 485. The integrated circuit 400 still further includes a ferromagnetic core 490. The integrated circuit 400 still further includes a plurality of inner-layer vias (collectively designated 493) that provide multiple paths between layers of the integrated circuit 400 and a terminal 496 for connection to another device.

The passivation layer 420 and first, second and third insulative layers 430, 450, 470 may be formed from an inorganic composition (e.g., silicon-dioxide, aluminum-dioxide, beryllium-dioxide), an organic polymer (e.g., a polyimide) or any other insulating material. The metallic adhesive is an inorganic-based material that is substantially (about 70%) free of titanium. While the first adhesive layer 480 generally contains materials selected from Group 4 elements (such as zirconium and hafnium; excluding about a 70% or more composition of titanium), Group 5 elements (such as vanadium, niobium and tantalum) and Group 6 elements (such as chromium, molybdenum and tungsten), other elements are well within the broad scope of the present invention. It should be noted that the above classifications of elements are compatible with the new International Union of Pure and Applied Chemistry notation indicated in the periodic table. Additionally, while the second adhesive layer 485 generally contains metals such as gold, silver, platinum, palladium and copper, other materials susceptible to plating a ferromagnetic material are well within the broad scope of the present invention. Again, while the ferromagnetic core 490 may be composed of an alloy (such as a permalloy™ or a cobalt-iron composition), other ferromagnetic materials (e.g., an amorphous nickel phosphide) are well within the broad scope of the present invention.

As previously mentioned, it is desirable to manufacture micromagnetic devices as integrated circuits. Employing alloys in the ferromagnetic core 490 is attractive since the relatively low magnetostriction constants may reduce the stress associated with the deposition processes. If relatively high stresses are associated with the deposition process, the magnetic properties of the integrated circuit 400 may be degraded and the thin films may lack the requisite adhesive properties necessary to facilitate the deposition of the integrated circuit 400. Obviously, an adhesive that counteracts the potential built-up stress in the films should be provided.

Several attempts have been undertaken to uncover an adhesive that provides a secure interface to a ferromagnetic material and an insulator. For instance, when a metal such as silver is exclusively used as the adhesive, the ferromagnetic material/silver interface is stronger than the insulator/silver interface. As a result, the ferromagnetic material and silver films may be peeled away from the substrate at a specified testing peel force (using a standard adhesion evaluation technique for less than 1 kG/cm$^2$). Conversely, when chromium is exclusively used as the adhesive, the insulator/chromium interface is stronger than the ferromagnetic material/chromium interface. As a result, the ferromagnetic material and silver films may be peeled away from the substrate at a specified testing peel force (using a standard adhesion evaluation technique for less than 1 kG/cm2). Additionally, the chromium does not provide an adequate seed layer for plating the ferromagnetic material. In conjunction with present invention, therefore, an adhesive is disclosed (as described above) that provides an adequate bond between the ferromagnetic core 490 and the insulators 430, 450, 470 coupled to the substrate 410 to facilitate the fabrication of the integrated circuit 400.

Figure 5A:
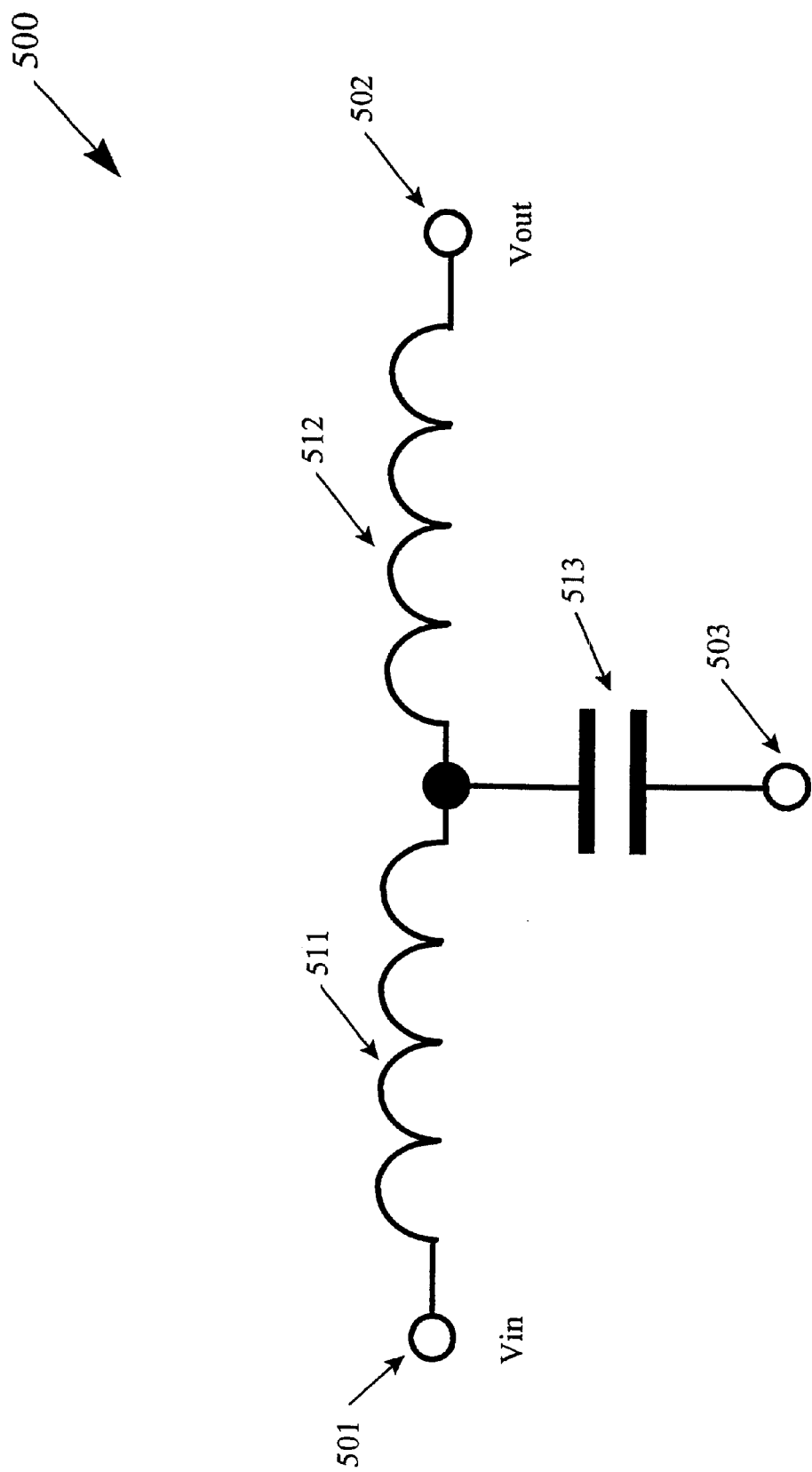
FIG. 5A illustrates a schematic diagram of an embodiment of a low pass filter circuit constructed according to the principles of the present invention.

Turning now to FIG. 5A, illustrated is a schematic diagram of an embodiment of a low pass filter circuit 500 constructed according to the principles of the present invention. The low pass filter circuit 500 includes first and second micromagnetic inductors 511, 512 and a capacitor 513 as shown. An input voltage Vin may be applied between terminals 501, 503, and a resulting output voltage Vout may be observed between terminals 502, 503. It is well understood that the magnitude of the output voltage Vout is frequency dependent and diminishes with increasing frequency beyond a cutoff frequency determined by the values of the first and second micromagnetic inductors 511, 512 and the capacitor 513.

Figure 5B:
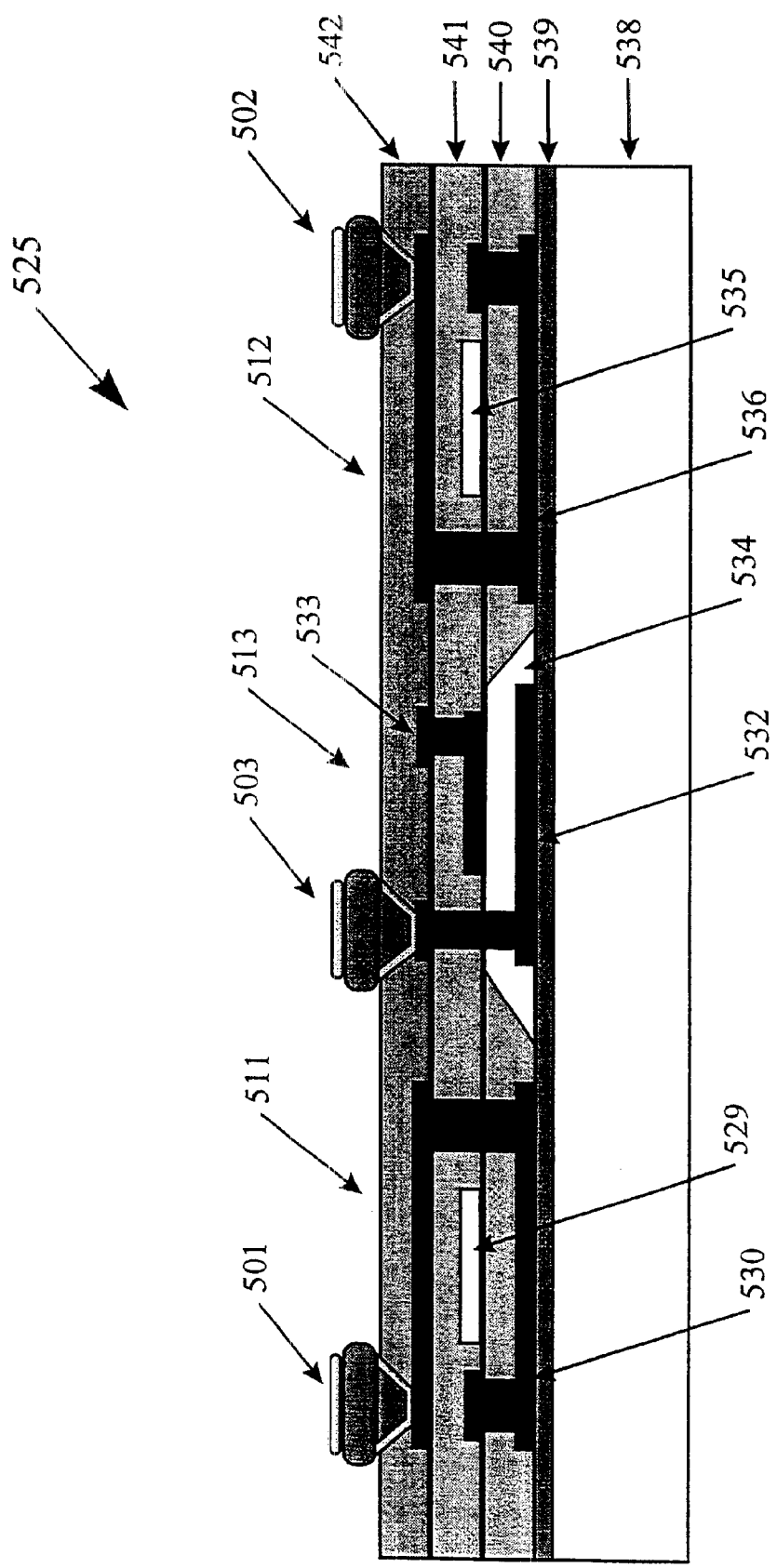
FIG. 5B illustrates a cross-sectional view of an integrated circuit showing an embodiment of the low pass filter circuit of FIG. 5A constructed according to the principles of the present invention.

Turning now to FIG. 5B, illustrated is a cross-sectional view of an integrated circuit 525 showing an embodiment of the low pass filter circuit of FIG. 5A constructed according to the principles of the present invention. The integrated circuit 525 includes a substrate 538, first, second, third and fourth insulators 539, 540, 541, 542 formed over the substrate 538, a capacitor 513 and first and second micromagnetic devices 511, 512 formed over the substrate 538. The capacitor 513 includes first and second capacitor plates 532, 533 and a dielectric layer 534. The first and second micromagnetic devices 511, 512 include an adhesive, which may be a metal adhesive comprising a plurality of layers, formed over the second insulator 540 that forms a bond between the second insulator 540 and first and second ferromagnetic cores 529, 535 according to the principles detailed previously in FIG. 4. The first and second ferromagnetic cores 529, 535 may contain an alloy material, and the second, third and fourth insulators 540, 541, 542 may be an organic polymer. The first insulator 539 is typically silicon dioxide, and the dielectric 534 is typically silicon nitride. Of course, other core, insulator and dielectric materials may be used as appropriate.

The first and second micromagnetic devices 511, 512, which are electrically coupled to the capacitor 513, further include first and second windings 530, 536, respectively, located proximate the first and second ferromagnetic cores 529, 535 to impart a desired magnetic property thereto. The integrated circuit 525 further includes first, second and third terminals 501, 502, 503 connected to the first and second micromagnetic devices 511, 512 and the capacitor 513, respectively. The first and second micromagnetic devices 511, 512 and the capacitor 513 are interconnected to form the low pass filter circuit 500 illustrated in FIG. 5A.

Figure 5C:
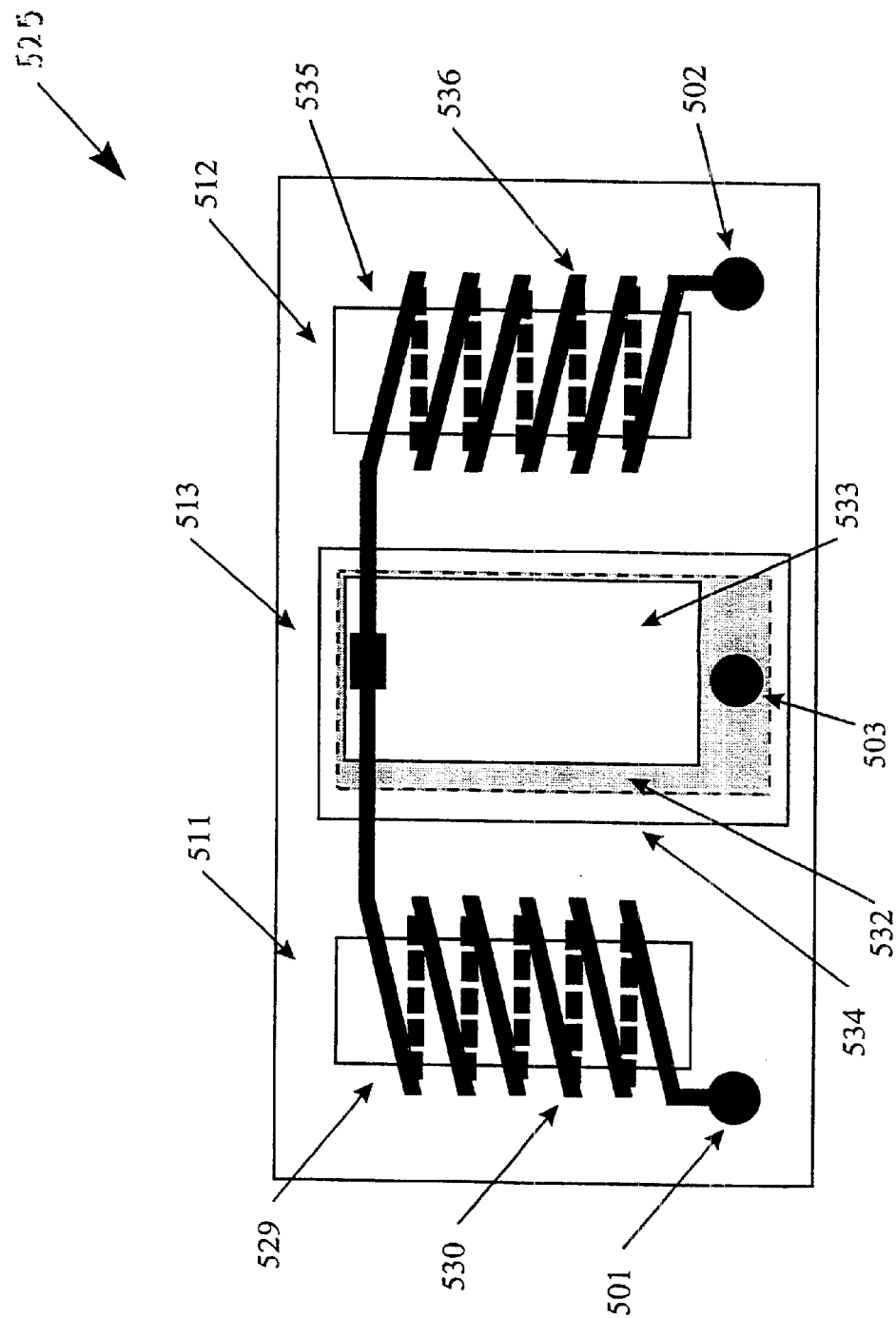
FIG. 5C illustrates a top view of the integrated circuit shown in the cross-section of FIG. 5B, which represents an embodiment of the low pass filter circuit of FIG. 5A.

Turning now to FIG. 5C, illustrated is a top view of the integrated circuit 525 that is shown in the cross-section of FIG. 5B representing an embodiment of the low pass filter circuit 500. The top view of the integrated circuit 525 shows the first and second micromagnetic devices 511, 512 and the capacitor 513. Details of the first and second windings 530, 536 are more clearly seen as are the interconnects between the first and second micromagnetic devices 511, 512 and the capacitor 513.

Figure 6A:
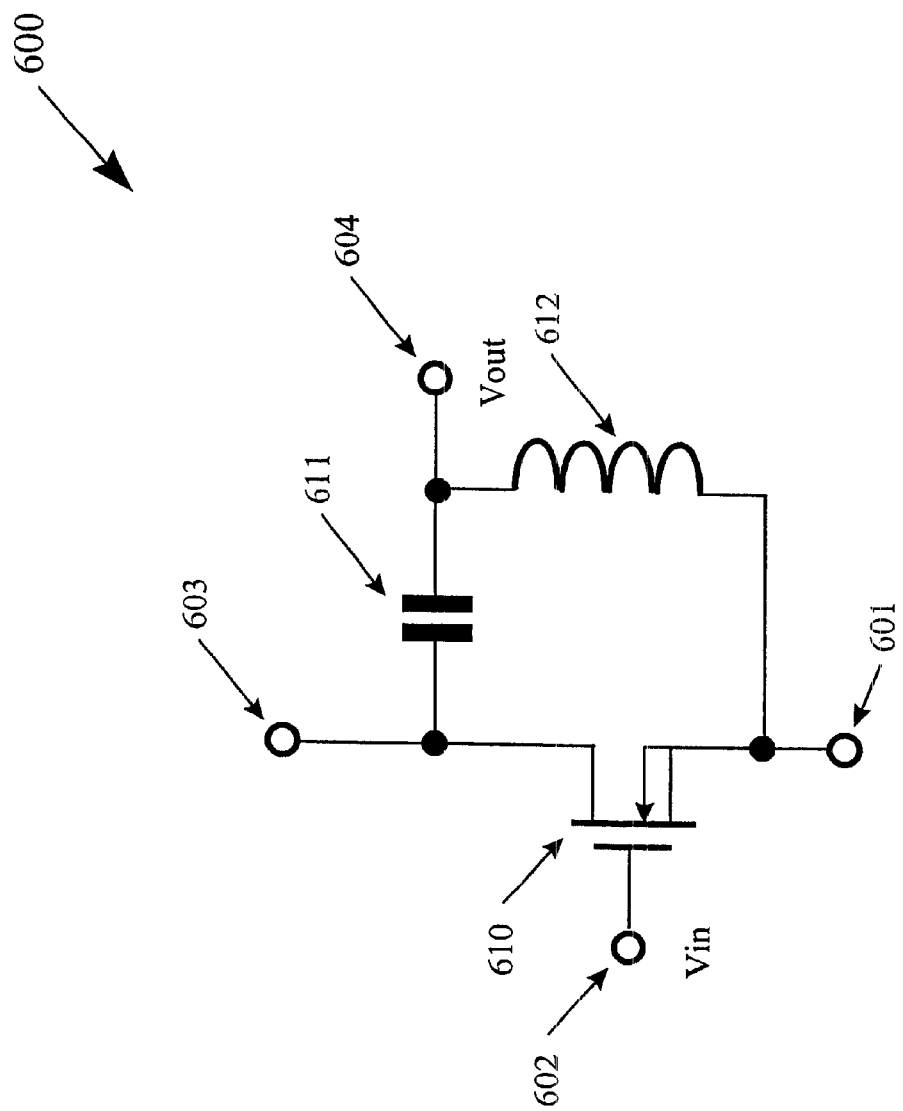
FIG. 6A illustrates a schematic diagram of a high pass filter circuit constructed according to the principles of the present invention.

Turning now to FIG. 6A, illustrated is a schematic diagram of a high pass filter circuit 600 constructed according to the principles of the present invention. The high pass filter circuit 600 includes a transistor (e.g., a MOSFET) 610, a capacitor 611, a micromagnetic inductor 612 and first, second, third and fourth terminals 601, 602, 603, 604. An input voltage Vin may be applied between the first and second terminals 601, 602 and an amplified, frequency-sensitive output voltage Vout may be obtained between the first and fourth terminals 601, 604. The first and third terminals 601, 603 are used for connecting a bias supply voltage to the MOSFET 610. For a constant amplitude input voltage Vin, the output voltage Vout increases directly with frequency until a frequency is reached where the output voltage Vout essentially becomes constant with frequency. This point is determined by the values of the capacitor 611 and the micromagnetic inductor 612.

Figure 6B:
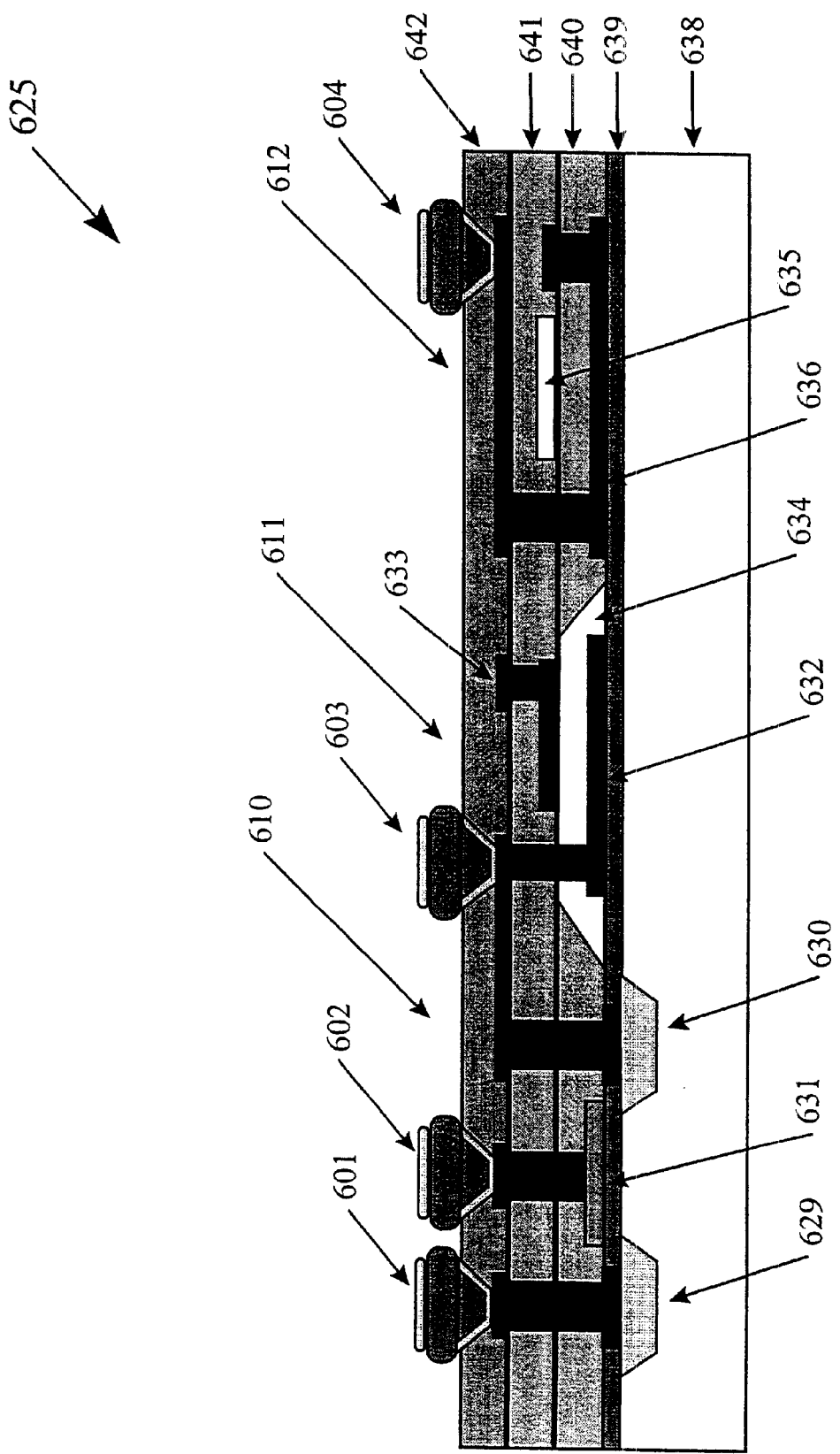
FIG. 6B illustrates a cross-sectional view of an integrated circuit showing an embodiment of the high pass filter circuit of FIG. 6A constructed according to the principles of the present invention.

Turning now to FIG. 6B, illustrated is a cross-sectional view of an integrated circuit 625 showing an embodiment of the high pass filter circuit 600 of FIG. 6A constructed according to the principles of the present invention. The integrated circuit 625 includes a substrate 638, first, second, third and fourth insulators 639, 640, 641, 642 formed over the substrate 638, a MOSFET 610, a capacitor 611 and a micromagnetic inductor 612 also formed over the substrate 638. The MOSFET 610 includes a source area 629, a drain area 630 and a gate area 631. The capacitor 611 includes first and second capacitor plates 632, 633 and a dielectric layer 634. The micromagnetic inductor 612 includes an adhesive, which may be a metal adhesive comprising a plurality of layers, formed over the second insulator 640 that forms a bond between the second insulator 640 and a ferromagnetic core 635 according to the principles detailed previously in FIG. 4. The ferromagnetic core 635 may contain an alloy material, and the second, third and fourth insulators 640, 641, 642 may be an organic polymer. The first insulator 639 is typically silicon dioxide, and the dielectric 634 is typically silicon nitride. Of course, other core, insulator and dielectric materials may be used as appropriate.

The micromagnetic inductor 612, which is electrically coupled to the MOSFET 610 and the capacitor 611, further includes a winding 636 located proximate the ferromagnetic core 635 to impart a desired magnetic property. The integrated circuit 625 further includes first, second, third and fourth terminals 601, 602, 603, 604 connected to the MOSFET 610, the capacitor 611 and the micromagnetic inductor 612 as shown. The MOSFET 610, the capacitor 611 and the micromagnetic inductor 612 are interconnected to form the high pass filter circuit 600 illustrated in FIG. 6A.

Figure 7A:
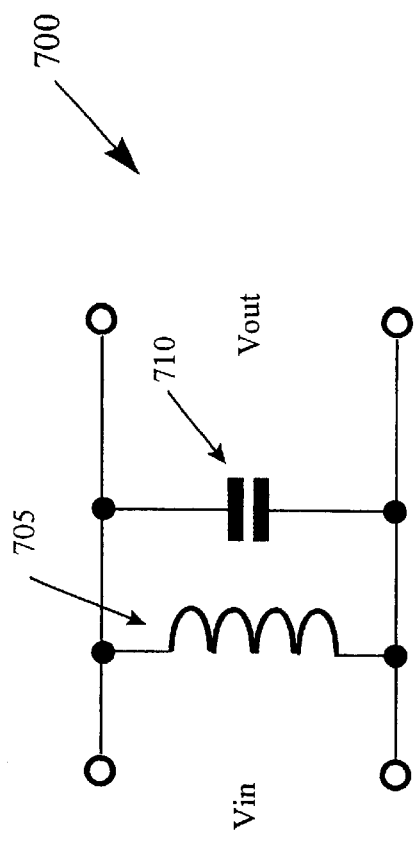
FIG. 7A illustrates a schematic diagram of a bandpass filter constructed according to the principles of the present invention.

Turning now to FIG. 7A, illustrated is a schematic diagram of a bandpass filter circuit 700 constructed according to the principles of the present invention. In this embodiment, the bandpass filter circuit 700 includes a micromagnetic inductor 705 and a capacitor 710 connected in a parallel arrangement as shown. An output voltage Vout is a frequency dependent function of an input voltage Vin. For a constant amplitude input voltage Vin, the output voltage Vout peaks in amplitude at a frequency determined by the values of the micromagnetic inductor 705 and the capacitor 710. Other embodiments may include a transistor or other circuit elements. This embodiment and other embodiments may be constructed in a manner similar to the integrated circuit 525 of FIG. 5B or the integrated circuit 626 of FIG. 6B as described above.

Figure 7B:
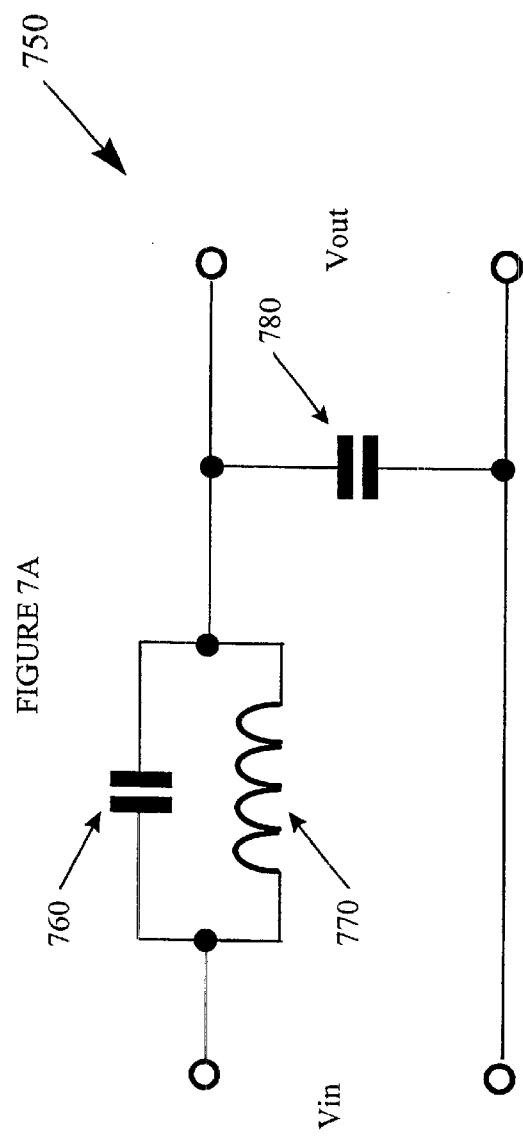
FIG. 7B illustrates a schematic diagram of a notch filter constructed according to the principles of the present invention.

Turning now to FIG. 7B, illustrated is a schematic diagram of a notch filter circuit 750 constructed according to the principles of the present invention. The notch filter circuit 750 includes first and second capacitors 760, 780 and a micromagnetic inductor 770. An output voltage Vout is also a frequency dependent function of an input voltage Vin. For a constant amplitude input voltage Vin, the output voltage Vout drops to a minimum value at a frequency determined by the values of the first and second capacitors 760, 780 and the micromagnetic inductor 770. Other embodiments may include a transistor or other circuit elements. This embodiment and other embodiments may be constructed in a manner similar to the integrated circuit 525 of FIG. 5B or the integrated circuit 626 of FIG. 6B as described above.

Figure 8:
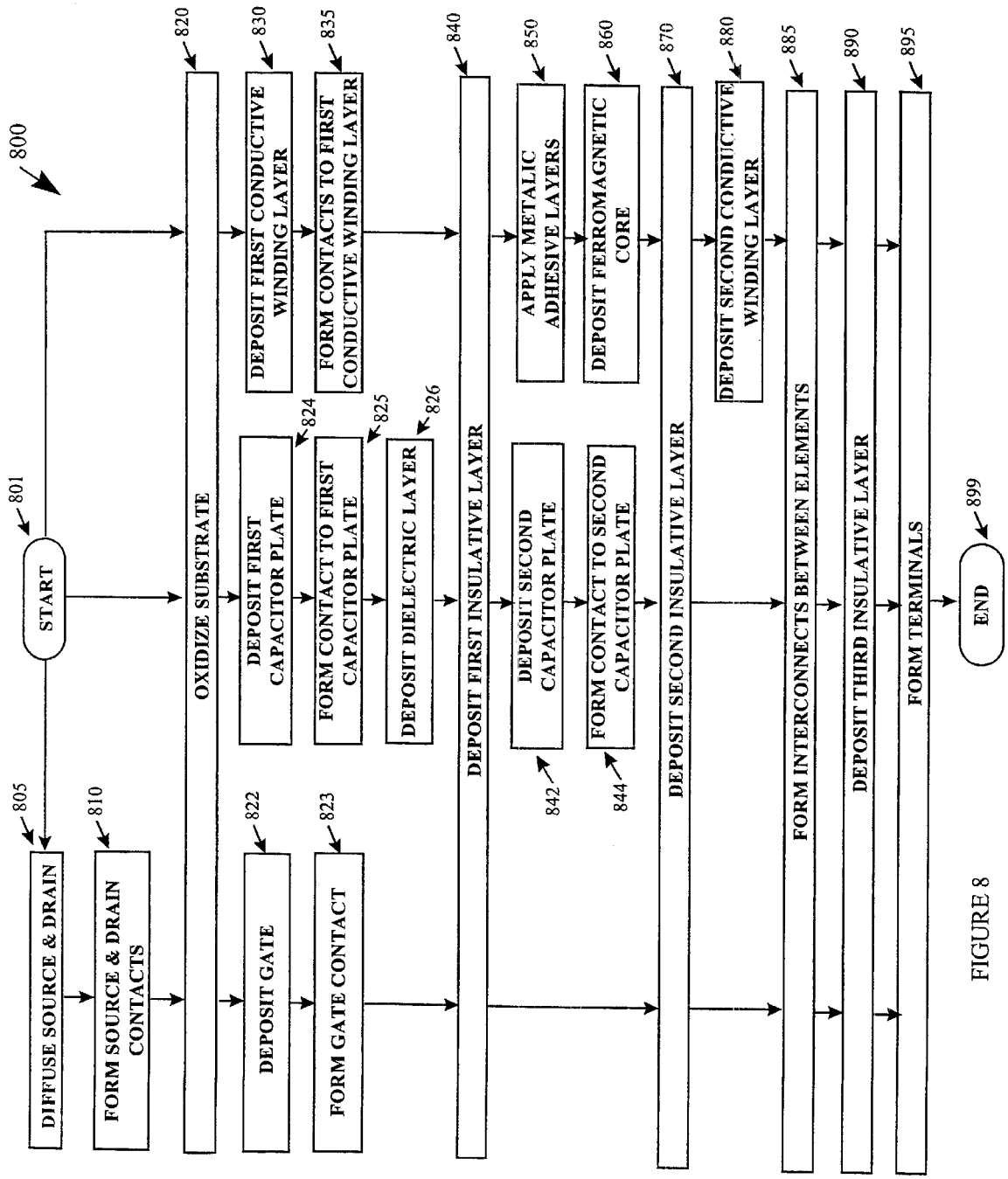
FIG. 8 illustrates a flow diagram of an embodiment of a method of manufacturing the integrated circuit of FIG. 6B.

Turning now to FIG. 8, illustrated is a flow diagram of an embodiment of a method (generally designated 800) of manufacturing the integrated circuit 625 of FIG. 6B. Portions of the method of manufacturing the integrated circuit 625 are analogous to conventional silicon-on-silicon multi-chip-module processes [see *Silicon-on-Silicon MCMs with Integrated Passive Components*, by R. C. Frye, et al., Proc. 1992 IEEE Multi-Chip Module Conference, p. 155, Santa Cruz, Calif. (March 1992), which is herein incorporated by reference] with the following variations. Generally, a photolithographic process with photoresist is used to define the geometrical features of the integrated circuit based upon a 10–20 μm design rule. While the rule is relatively coarse, it is adequate for fabricating devices such as the integrated circuit 625 since the major dimensions are multiples of the 10–20 μm rule. The photolithographic process generally includes the steps of exposing and developing the photoresist. The photolithographic process also includes etching and stripping away unwanted portions of the material to which the process is being applied. Those skilled in the art should be familiar with conventional photolithographic processes.

The method begins at a start step 801 with a silicon substrate. Source and drain areas for the MOSFET 610 are diffused into the silicon substrate in a diffuse source and drain step 805. These diffusion areas are n-type diffusions requiring a p-substrate for the MOSFET polarity shown in FIG. 6A. Of course, the polarities may be reversed if an opposite polarity MOSFET is desired. Then, contacts for the source and drain are formed in a form contacts step 810. The silicon substrate is oxidized with a passivation layer in an oxidize substrate step 820. The passivation layer is generally created using conventional thermal growing techniques or chemical vapor deposition techniques. Of course, the substrate may be blank or may be composed of a pre-fabricated wafer with underlying circuitry and final passivation.

Next, a gate is deposited for the MOSFET in a deposit gate step 822, and then a first capacitor plate is deposited for the capacitor in a deposit first capacitor plate step 824. The integrated circuit 625 employs a toroidal micromagnetic device structure that includes multiple layers. A first conductive winding layer is then blanket deposited on the substrate during a deposit first conductive winding layer step 830. The first conductive winding layer may be composed of aluminum, having a thicknesses of about 2–10 μm, that is sputter deposited (for instance, at 5 mtorr Argon pressure and room temperature) on the passivation layer. For thicker conductor traces (to achieve lower resistance), electroplated copper may be used, resulting in thicknesses up to about 25 μm.

A contact for the gate is then formed in a form gate contact step 823, and a contact for the first capacitor plate is formed in a form contact to first capacitor plate step 825. The first conductive winding layer is then patterned to the desired configuration (including the desired contact regions for the integrated circuit) using a conventional photolithographic process in a form contacts for first conductive winding layer step 835. Of course, another contact region may be formed in the first conductive winding layer to facilitate electrical connectivity to other circuits coupled to the substrate as required.

A dielectric layer for the capacitor is then deposited in a deposit dielectric layer step 826. The dielectric layer is typically composed of silicon nitride, but other materials may be used as appropriate. The first insulative layer may then be spin coated on the passivation layer, existing MOSFET and capacitor structures and the first conductive winding layer during a deposit first insulative layer step 840. The first insulative layer is then cured (at about 350° C. for approximately 12 hours). After shrinkage, the insulative layer is about 3–5 μm thick. The spin coating techniques generally provide higher voltage isolation between primary and secondary micromagnetic device windings. The voltage level breakdown values for isolation vary from 500 volts alternating current ("VAC") to 3000 VAC. The first insulative layer is then patterned using a conventional photolithographic process to form inner-layer vias therethrough.

A second capacitor plate is then deposited in a deposit second capacitor plate step 842, and the metallic adhesive, including the first and second adhesive layers, is blanket deposited on the first insulative layer during an apply metallic adhesive layer step 850. The first adhesive layer may be composed of chromium, sputter deposited (for instance, at 5 mtorr Argon pressure and 250° C.) to a thickness of about 250 Å on the first insulative layer. The second adhesive layer may be composed of silver, sputter deposited (for instance, at 5 mtorr Argon pressure and room temperature) to a thickness of about 500 Å on the first adhesive layer. The metallic adhesive also serves as a seed layer for plating the ferromagnetic core.

A contact is formed to the second capacitor plate in a form contact to second capacitor plate step 844, and the ferromagnetic core is deposited (e.g., electroplated to a thickness of about 2–12 μm) on the metallic adhesive during a deposit ferromagnetic core step 860. The ferromagnetic core may be plated in a buffered sulfamate bath under a controlled temperature (e.g., 25–35° C.) with a current density of about 30 mA/cm². The metallic adhesive and ferromagnetic core are patterned to the desired configuration using a photolithographic process.

With regard to the photolithographic process, the etching solutions should be capable of removing the unwanted metallic adhesive (e.g., chromium-silver composition) without attacking the deposited ferromagnetic film. For instance, a standard commercial cerric ammonium nitrate ("CAN") formulation etch solution etches the silver at the rate of about 50 Å/sec and etches the chromium at the rate of 250 Å/min without substantially affecting the ferromagnetic material. Thus, employing a CAN etch for approximately 60–75 seconds is adequate to pattern the metallic adhesive and ferromagnetic core. Again, the first adhesive layer (e.g., chromium) is preferably deposited in the range of 200–300 (250 nominal)Å and the second adhesive layer (e.g., silver) is preferably deposited in the range of 400–600 (500 nominal)Å to facilitate a controllable etch process.

Furthermore, to eliminate possible lateral etching and undercutting beneath the ferromagnetic core, the second adhesive layer may be composed of copper. In this case, a potassium iodide and water solution may be applied for about 10 seconds to perform the copper etching process and a potassium ferri-cyanide and potassium hydroxide solution may be applied for about 1–2 seconds to perform the chromium etching process. The potassium ferri-cyanide and potassium hydroxide solution does not substantially affect the copper layer underlying the ferromagnetic core, thereby preventing the potential affects of undercutting. Of course, other types of etching processes (such as ion etching) are well within the broad scope of the present invention. Additionally, an external magnetic field, as described in FIG. 2B, may be applied during the deposit ferromagnetic core step 860 to achieve a tailored B-H curve and, for instance, a specific permeability.

The second insulative layer is spin coated on the ferromagnetic core and the first insulative layer during a deposit second insulative layer step 870. The second insulative layer is then patterned using a photolithographic process to form the inner-layer vias therethrough. The second conductive winding layer is then blanket deposited (e.g., sputtered) on the second insulative layer during a deposit second winding conductive layer step 880. The second conductive winding layer is then patterned to the desired configuration (including the desired contact regions) using a photolithographic process. Next, the third insulative layer is spin coated on the second conductive winding layer and the second insulative layer during a deposit third insulative layer step 890. Terminals are finally formed in the third insulative layer during a form terminal step 895. The terminals are either suitable for wire bonding (e.g., aluminum wire bonding) or may be finished with a solder-wettable metal (e.g., chromium) for use with solder pastes for flip-chip assembly as shown in FIG. 6B. The method terminates at an end step 899. A completed wafer may then be packaged as an integrated circuit or bare die mounted as in flip-chip assemblies.

While the preceding FIGUREs illustrate embodiments of an integrated circuit for use in power processing, data transmission applications, RF circuits and motor control circuitry along with a method of manufacture (including the photolithographic process) therefor, other applications and variations of the micromagnetic device and methods of manufacture therefor are well within the broad scope of the present invention. It should also be clear that the precise dimensional and other quantitative information and the specified materials are submitted for illustrative purposes only.

For a better understanding of integrated circuits and methods of manufacture therefor see *Handbook of Sputter Deposition Technology*, by K. Wasa and S. Hayakawa, Noyes Publications (1992); *Thin Film Technology*, by R. W. Berry, P. M. Hall and M. T. Harris, Van Nostrand (1968); *Thin Film Processes*, by J. Vossen and W. Kern, Academic (1978); and *Handbook of Thin Film Technology*, by L. Maissel and R. Glang, McGraw Hill (1970). For a general reference regarding electronics including data transmission systems see *Reference Data for Engineers: Radio, Electronics, Computers and Communications*, 7th edition, Howard W. Sams & Company (1988) and power electronics, power magnetic devices and power converter topologies see *Principles of Power Electronics*, by J. Kassakian, M. Schlecht, Addison-Wesley Publishing Company (1991). The aforementioned references are herein incorporated by reference.

Although the present invention has been described in detail, those skilled in the art should understand that they can make various changes, substitutions and alterations herein without departing from the spirit and scope of the invention in its broadest form.

What is claimed is:

1. A method of manufacturing an integrated circuit, comprising:

providing a substrate;

forming an insulator over said substrate;

forming a capacitor over said substrate;

forming a metallic adhesive over said insulator by:
    forming a first layer comprising a first metal, and
    forming a second layer comprising a second metal; and
    forming a micromagnetic device by:
    forming a ferromagnetic core over said adhesive, said adhesive forming a bond between said insulator and said ferromagnetic core to secure said ferromagnetic core to said substrate, and
    locating at least one winding proximate said ferromagnetic core to impart a desired magnetic property to said ferromagnetic core, said micromagnetic device electrically coupled to said capacitor.

2. The method as recited in claim 1 wherein said micromagnetic device is selected from the group consisting of:

an inductor, and a transformer.

3. The method as recited in claim 1 wherein said integrated circuit is device selected from the group consisting of:

a band pass filter, a low pass filter, a notch filter, and a high pass filter.

4. The method as recited in claim 1 further comprising forming a transistor on said substrate, said transistor electrically coupled to said micromagnetic device.

5. The method as recited in claim 4 wherein said circuit selected from the group consisting of:
   a RF circuit,
   a motor control circuit,
   a data transmission circuit, and
   a power processing circuit.

6. The method as recited in claim 4 wherein said transistor is a metal-oxide semiconductor field-effect transistor (MOSFET).

7. The method as recited in claim 1 wherein said ferromagnetic core contains an alloy material.

8. The method as recited in claim 1 wherein said insulator includes an organic polymer.

9. The method as recited in claim 1 wherein said ferromagnetic core has a thickness substantially less that a skin depth thereof.

10. The method as recited in claim 1 wherein said forming said ferromagnetic core includes forming a plurality of insulated magnetic film layers.

11. The method as recited in claim 10 wherein each of said plurality of insulated magnetic film layers has a thickness substantially less than a skin depth thereof.

12. The method as recited in claim 1 wherein said desired magnetic property is an anisotropic property.

13. The method as recited in claim 1 wherein said first material includes tungsten.

14. The method as recited in claim 1 wherein said second material includes silver.

15. A method of manufacturing an integrated circuit, comprising:
   locating a capacitor over a substrate, including:
      locating a first capacitive plate layer over said substrate,
      locating a dielectric layer over said first capacitive plate layer, and
      locating a second capacitive plate layer over said dielectric layer; and
   forming a micromagnetic device electrically coupled to said capacitor, including:
      locating a first conductive winding layer over said substrate proximate said capacitor,
      locating a first insulative layer over said first conductive winding layer,
      locating a metallic adhesive over said first insulative layer by forming a first layer comprising a first metal and forming a second layer comprising a second metal, and
      locating a ferromagnetic core over said metallic adhesive, said adhesive forming a bond between said first insulative layer and said ferromagnetic core to secure said ferromagnetic core to said substrate.

16. The method as recited in claim 15 wherein said forming said micromagnetic device further comprises:
   locating a second insulative layer over said ferromagnetic core;
   locating a second conductive winding layer located over said second insulative layer; and
   locating a third insulative layer over said second conductive winding layer.

17. The method as recited in claim 15 further comprising locating a transistor over said substrate and electrically coupling said transistor to said micromagnetic device.

18. The method as recited in claim 15 wherein said first metal is tungsten and said second metal is silver.

* * * * *